United States Patent
Zommer

[11] Patent Number: 6,162,665
[45] Date of Patent: Dec. 19, 2000

[54] HIGH VOLTAGE TRANSISTORS AND THYRISTORS

[75] Inventor: Nathan Zommer, Los Altos, Calif.

[73] Assignee: Ixys Corporation, Santa Clara, Calif.

[21] Appl. No.: 08/698,852

[22] Filed: May 23, 1995

Related U.S. Application Data

[63] Continuation of application No. 08/137,824, Oct. 15, 1993, abandoned.

[51] Int. Cl.[7] .................................................. H01L 21/332
[52] U.S. Cl. .......................... 438/133; 438/459; 438/138; 148/DIG. 126
[58] Field of Search ........................... 438/133, 135–138, 438/192, 268, 269, 273, 459, FOR 140, FOR 192, FOR 176, FOR 485; 148/DIG. 126

[56] References Cited

U.S. PATENT DOCUMENTS

| | | | |
|---|---|---|---|
| 3,701,696 | 10/1972 | Mets | 438/133 |
| 4,935,386 | 6/1990 | Nakagawa et al. | 438/138 |
| 5,164,218 | 11/1992 | Tsuruta et al. | 438/138 |
| 5,204,282 | 4/1993 | Tsuruta et al. | 438/459 |
| 5,298,457 | 3/1994 | Einthoven et al. | 437/131 |
| 5,506,153 | 4/1996 | Brunner et al. | 438/133 |
| 5,547,886 | 8/1996 | Harada | 438/268 |

OTHER PUBLICATIONS

S. Wolf & R.N. Tauber, "Silicon Processing for the VLSI Era" vol. I, p. 28, 1986 Lattice Press.

*Primary Examiner*—Charles Bowers
*Assistant Examiner*—Scott J. Hawranek
*Attorney, Agent, or Firm*—Townsend & Townsend & Crew LLP

[57] ABSTRACT

A high voltage transistor or thyristor having a base layer which is a thinned neutron transmuted wafer 102, 152 instead of a diffused or epitaxially grown base layer. The neutron transmuted wafer has high resistivity and a desired thickness while the layer formed overlying the surface of the neutron transmuted wafer has a desired thickness and doping level. Adjusting the thicknesses and doping levels within these two structures produce a device having the desire high voltage characteristics. The various embodiments provides for a high voltage MOSFET 100, IGBT 170, and thyristor.

10 Claims, 3 Drawing Sheets

HIGH VOLTAGE TRANSISTORS AND THYRISTORS

This application is a continuation of Ser. No. 08/137,824 filed Oct. 15, 1993 now abandoned.

BACKGROUND OF THE INVENTION

The present invention relates to high voltage semiconductor switching devices known as high voltage transistors, power MOSFETs, IGBTs, thyristors, and MCTs.

High voltage transistors, power metal oxide silicon field effect transistors (MOSFETs), insulated gate bipolar transistors (IGBTs), thyristors, and MOS controlled thyristors (MCTs), hereinafter referred to as high voltage devices, are fabricated by conventional semiconductor processing techniques on a single crystalline semiconductor substrate such as a silicon wafer. Conventional semiconductor processing techniques include doping and implanting, lithography, diffusion, chemical vapor deposition (CVD), wet and dry etching, sputtering, epitaxy, and oxidizing. A complex sequence of these processing techniques is required to produce a high voltage device having a breakdown voltage within the 30 to 1,800 volt range.

The performance characteristics of the resulting high voltage device are dependent upon the resistivity (or doping concentration) and thickness of the crystalline semiconductor substrate. This is especially true for those devices having a breakdown voltage near the upper end of the 30 to 1,800 volt range. To fabricate the device, one provides a heavily doped semiconductor substrate which consequently has low resistivity. A highly resistive epitaxial layer is formed overlying a top surface of the semiconductor substrate. This combination including the highly resistive epitaxial layer produces a device having a high breakdown voltage.

However, the highly resistive epitaxial layer also decreases the efficiency of the device. In particular, the highly resistive epitaxial layer creates a large on-state voltage drop through the device. This increases energy loss through heat dissipation. Increasing the amount of heat dissipated produces a resulting device with a higher operating temperature, thereby decreasing the amount of current flowing through the device. This current reduction effectively decreases the functional efficiency of the device. To control this functional efficiency, one tailors the thickness and doping level of the epitaxial layer and substrate to produce a desired resistance level between them. A functionally efficient device is produced by limiting the thickness of the highly resistive epitaxial layer.

For transistors having a breakdown voltage above 1,000 volts, the thickness of the epitaxial layer overlying the substrate typically exceeds 150μ. In addition, this epitaxial layer must also have high resistivity. Present fabrication techniques for forming this thick highly resistive epitaxial layer include methods of chemical vapor deposition, or the like. These techniques are extremely slow and very difficult to control at their high processing temperatures and low impurity requirements. Thus, present fabrication techniques produce significantly low device yields, and are not cost effective in producing the device having the high breakdown voltage.

As for thyristors, one typically provides non-epitaxial substrates, also called bulk substrates, for fabrication. The substrates include a single-type doped and concentration doped wafer. The single-type doped wafer has a uniform doping level throughout the substrate. Alternatively, the concentration-doped wafer possesses a dopant profile having a concentration gradient. However, high voltage applications typically require a neutron transmuted substrate. These substrates rely on neutron irradiation to transmute a desired amount of silicon atoms into phosphorus atoms within the crystalline structure. This process forms the highly resistive n-type neutron transmuted wafer for high voltage applications.

For thyristors having a single-type doped wafer, the desired breakdown voltage is achieved by tailoring the overall thickness of the substrate. The thickness of the substrate is adjusted to produce a desired resistivity, thereby producing its corresponding breakdown voltage. The minimum thickness of the wafer depends, however, upon a thickness having sufficient structural integrity which can be processed without unreasonable breakage. So far, state-of-art wafer handling techniques by operators and equipment limit the thickness of these wafers by processing thicker-than-needed wafers. These thicker-than-needed wafers have increased mechanical stability, and therefore ensure that costly handling losses do not occur. As such, the resulting devices have higher-than-needed on-state voltage drops, higher energy losses during switching, and diminished performance.

SUMMARY OF THE INVENTION

The present invention provides superior high voltage devices by relying upon a unique combination comprising heavily doped epitaxial layers overlying a highly resistive neutron transmuted semiconductor substrate having a desired thickness. Benefits of the present invention are achieved in the context of known technology.

The present invention provides a high voltage semiconductor switching device as follows. The device includes a neutron transmuted semiconductor substrate having a backside and front surface. A heavily doped layer is formed on and in contact with the front surface of the substrate. To produce the desired high breakdown voltage characteristics, the thicknesses and doping levels of the substrate as well as the epitaxial layers are adjusted accordingly. The overall resistivity of the substrate is tailored by reducing the thickness of the wafer by grinding, polishing, or thinning the substrate from its backside. The semiconductor substrate is then turned up-side-down and further processing is performed on the backside of the wafer. The active devices, including a variety of high voltage transistors and thyristors, are formed on the thinned down backside of the neutron transmuted wafer.

Embodiments of the present invention include active devices such as a high voltage transistors, power MOSFETs, IGBTs, thyristors, MCTs, or the like.

A further understanding of the nature and advantages of the present invention may be realized by reference to the latter portions of the specification and attached drawings.

DESCRIPTION OF SPECIFIC EMBODIMENTS

Prior Art High Voltage Devices

Figure 1:
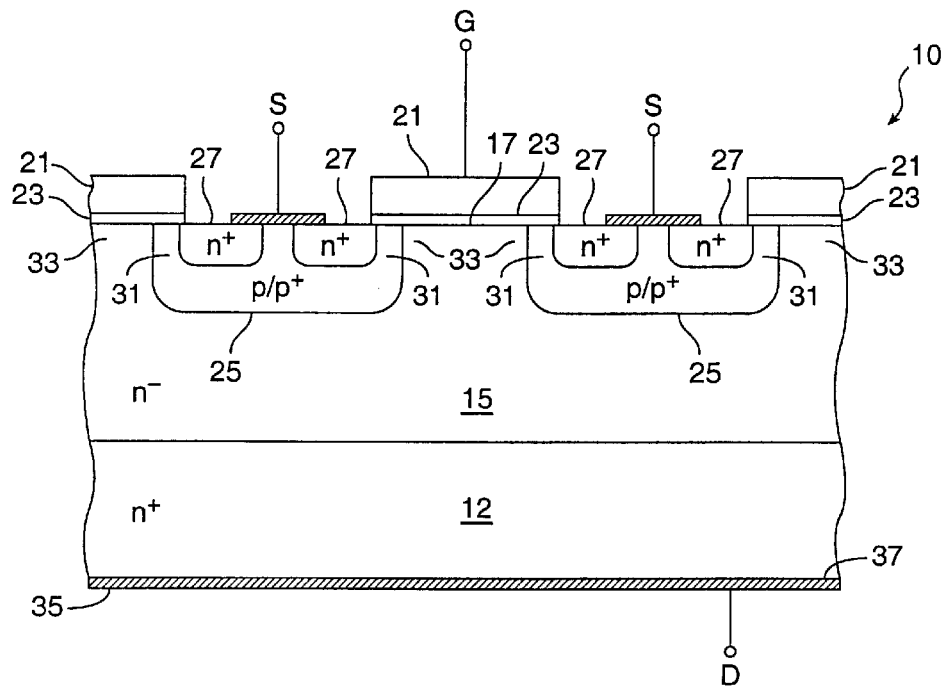
FIG. 1 is a cross-sectional view of a prior art power MOSFET device.

FIG. 1 is a simplified cross-sectional view of a prior art power MOSFET device 10. This device may be fabricated by a double diffused MOS process (DMOS). One typically builds this device by providing a wafer of $n^+$ conductivity 12. An $n^-$ epitaxial layer 15 with a top surface 17 is formed overlying the $n^+$ substrate. For high voltage applications, the $n^-$ epitaxial layer must be thick and highly resistive. For devices having a breakdown voltage above 1,000 volts, the epitaxial layer typically has a low level of impurities and has a thickness exceeding $150\mu$. This result is often difficult to achieve.

Nevertheless, to complete the device, a gate (G) is defined by a polysilicon gate layer 21 overlying a layer of oxide 23. As shown, $p/p^+$ well regions 25 are defined within this $n^-$ epitaxial layer. A plurality of sources (S) are defined by $n^+$ source regions 27 within the $p/p^+$ well regions. A plurality of n-channel regions 31 are defined within $p/p^+$ well regions. The channel region is adjacent to the top surface, and between the $n^+$ source region and a portion 33 of $n^-$ layer. A drain (D) is defined on the back metallization 35 overlying the backside 37 of the substrate. The source, n-channel region, drain, and gate define a power MOSFET.

The prior art device of FIG. 1 forms an active region of a typical chip. An active area may comprise hundreds, thousands, or even millions of these microscopically small regions, each defining an active MOSFET device. These devices may comprise cells which are all connected in parallel. Alternatively, these regions may comprise stripes or the like defining the active device. These structures of the active device, whether cells or strips, do not typically affect its high voltage characteristics.

Figure 2:
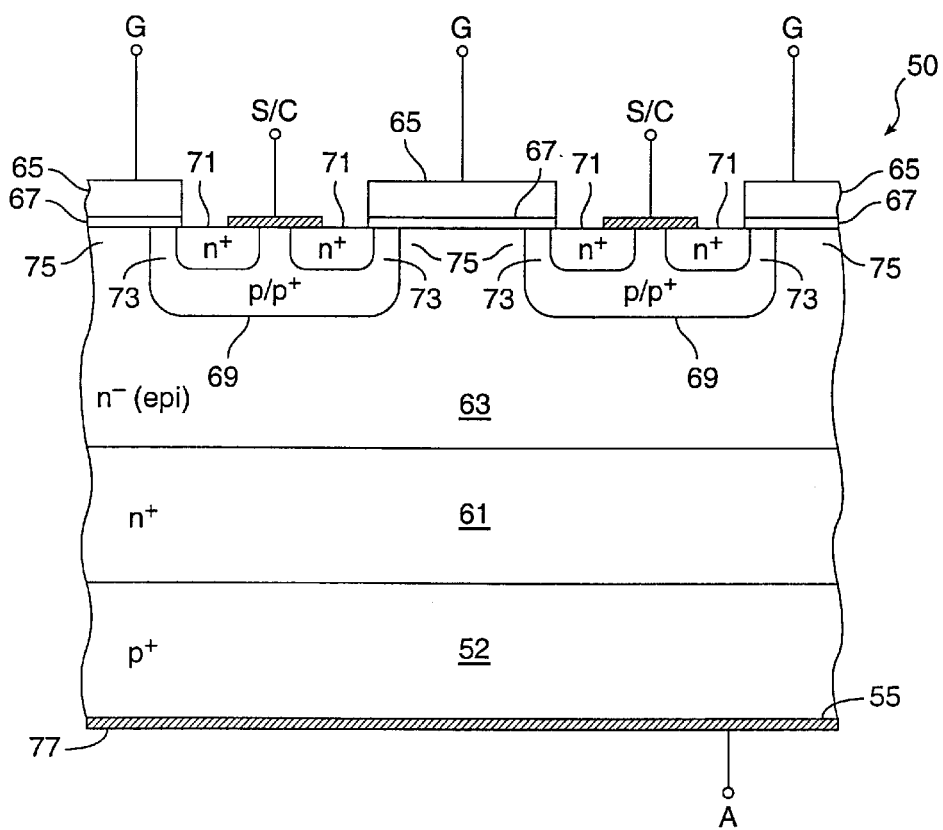
FIG. 2 is a cross-sectional view of a prior art IGBT or thyristor.

FIG. 2 is a simplified cross-sectional view of a prior art IGBT or thyristor device 50. This device is typically fabricated by a DMOS process. As shown, one provides a $p^+$ substrate 52 having a backside 55 and front surface 57. An $n^+$ layer 61 is diffused onto the front surface of the substrate. An $n^-$ epitaxial layer 63 is formed on the diffused $n^+$ layer and active regions are formed therein. However, high voltage applications (typically breakdown voltages above 1,000 volts) require a heavily doped substrate and a thick (greater than $150\mu$), highly resistive n epitaxial layer. As discussed, this result is often difficult to achieve with present technology.

Nevertheless, to the complete the device, a gate (G) is defined by a polysilicon layer 65 overlying a layer of oxide 67. A plurality of $p/p^+$ well regions 69 are defined within the $n^-$ epitaxial layer. Source regions (S) are defined by the $n^+$ source regions 71 within the $p/p^+$ well regions. Channel regions 73 are within the $p/p^+$ well regions, and are between the $n^+$ source regions and portions 75 of the $n^-$ epitaxial layer. The device also includes an anode (A) defined by the metallization 77 overlying the backside of the substrate, and a cathode (C).

The IGBT or thyristor of FIG. 2 forms each active region of a typical chip. An active area may comprise hundreds, thousands, or even millions of these microscopically small regions, each defining an active IGBT or thyristor structure. These devices may comprise cells or stripes, or the like defining the active device. As discussed, the structure of the device, whether cells or stripes, do not typically affect its high voltage characteristics.

Depending upon whether the device shown in FIG. 2 operates as an IGBT or thyristor depends upon the resistance levels of the layers. For thyristor operation, latch-up is promoted by decreasing the doping in the $p/p^+$ well regions while heavily doping the substrate. This also increases the gain through the device. IGBT operation, however, requires low resistivity through the $n^-$ epitaxial layer which does not promote latch-up. Thus, the dopant levels within each layer must be adjusted accordingly to provide IGBT or thyristor operation.

The prior art devices of FIGS. 1 and 2 require a highly resistive semiconductor layer overlying the substrate to achieve high voltage capability (voltages over 1000 volts). Fabricating this highly resistive layer requires a processing technique which has the capability of producing a thick layer having a low doping level. These features are, however, difficult to obtain with present technology. In particular, it is difficult to fabricate a thick highly resistive epitaxial layer or a thick highly resistive diffused layer with present technology. The thick highly resistive epitaxial layer typically requires a long growth process having a high level of cleanliness to achieve the desired dopant level. Alternatively, a thick highly resistive diffused layer also requires a long diffused process where the region near the surface of this layer inherently has low resistivity. As such, the present method for epitaxially growing this thick highly resistive layer is not cost effective with present technology. This makes the high voltage devices having a breakdown voltage greater than 1000 volts economically inefficient to fabricate.

High Voltage MOSFET

Figure 3A:
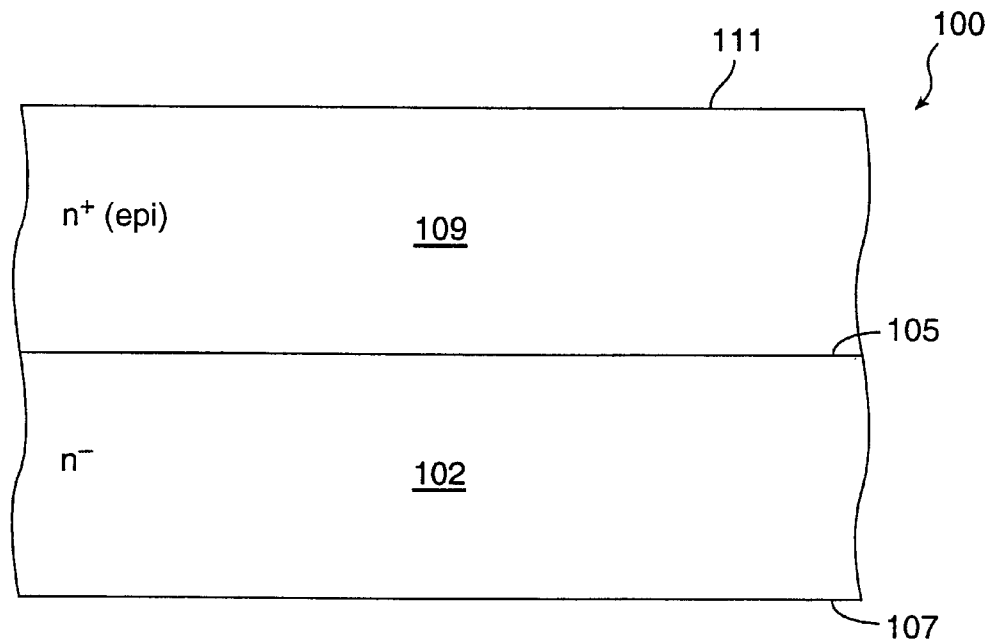
FIG. 3A is a cross-sectional view of an embodiment of an improved substrate for a high voltage MOSFET.

FIG. 3A shows an embodiment of a substrate 100 for a high voltage switching device such as, for example, a high voltage MOSFET according to the present invention. As shown, one provides a highly resistive n semiconductor substrate 102 having a front surface 105 and backside 107. This wafer may be a silicon substrate, gallium arsenide substrate, or the like. Alternatively, high voltage applications typically require the substrate to be a neutron transmuted wafer. The neutron transmuted wafer has a low dopant level to create a highly resistive substrate. The dopant level within these substrates is, for example, $10^{13}$ atoms/cm$^3$.

A heavily doped $n^+$ epitaxial layer 109 is then formed overlying the front surface of the $n^-$ substrate. The $n^+$ epitaxial layer has a top surface 111. Alternatively, an epitaxial layer having p-type conductivity could be formed overlying the front surface of the $n^-$ substrate. This embodiment, however, employs the $n^+$ epitaxial layer. Since the epitaxial layer is heavily doped, one can efficiently fabricate the resulting structure with present technology.

To produce the desired high voltage characteristics, one reduces the thickness of the semiconductor substrate from its backside by the methods of polishing, backgrinding, thinning, or the like. The resulting high voltage substrate includes a combination comprising a thick highly resistive neutron transmuted wafer and a heavily doped epitaxial layer. This combination produces features which can achieve high voltage capability. However, the thicknesses and dopant levels of the substrate and epitaxial layer are tailored to create the desired high voltage characteristics. The substrate has a thickness between about $200\mu$ and $500\mu$ or greater where a higher voltage device requires a thicker substrate. To complete the device, further processing is performed by turning the wafer up-side-down and fabricating the active regions on the backside of the wafer. The active region may be, for example, a high voltage MOSFET device as shown in FIG. 3B.

Figure 3B:
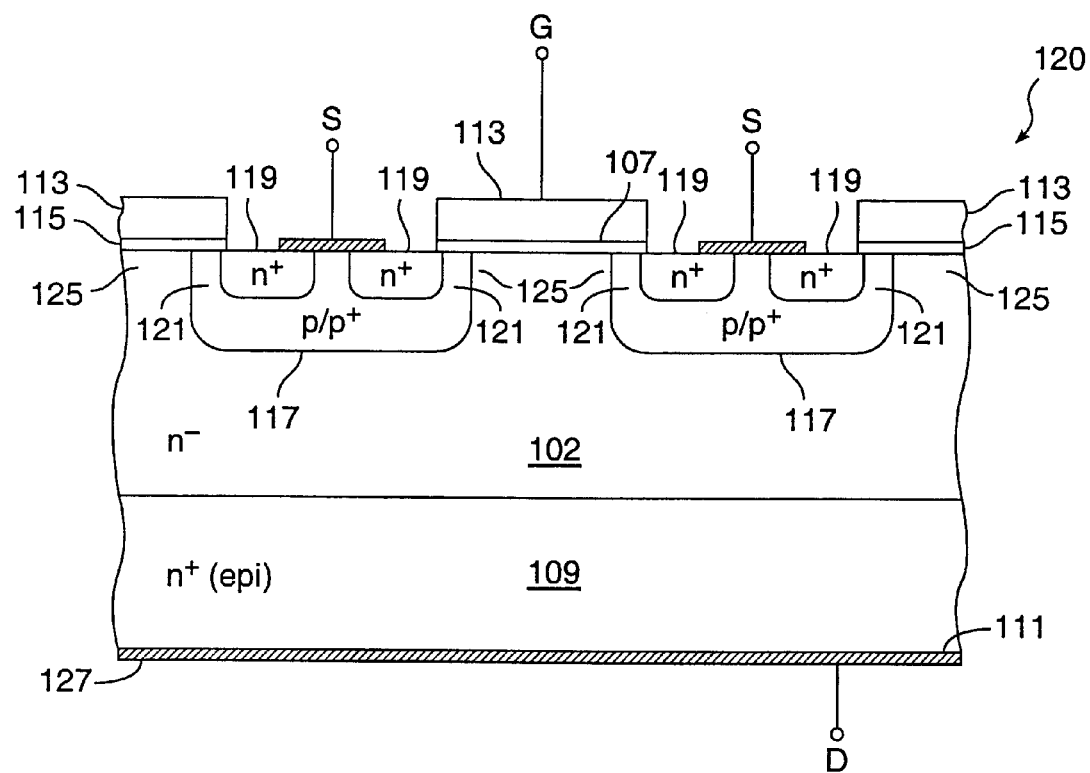
FIG. 3B is a cross-sectional view of an embodiment of an improved high voltage MOSFET.

The high voltage MOSFET device 120 of FIG. 3B is fabricated from the substrate shown in FIG. 3. The device fabricated employs, for example, n-channel technology for illustrative purposes only. Alternatively, the device may be fabricated with p-channel technology, or the like. The gate (G), source (S), channel, and drain (D) are formed in a manner similar to the prior art device of in FIG. 1, except processing is done on the backside of the wafer 107 as follows. A gate (G) is defined as a polysilicon gate layer 113 overlying a layer of oxide 115. As shown, p/p$^+$ well regions 117 are defined within the n$^-$ substrate. A plurality of sources (S) are defined by n$^+$ source regions 119 within the p/p$^+$ well regions. A plurality of n-channel regions 121 are defined within p$^+$ well regions. The channel regions are adjacent to the backside surface 107, and are between the n$^+$ source region 119 and a portion 125 of n$^-$ substrate. A drain (D) is defined on the metallization 127 overlying the top surface. The source, n-channel region, drain, and gate define a high voltage MOSFET device.

The embodiments of the present invention shown in FIGS. 3A and 3B have high voltage capability. This high voltage capability comes from the unique fabrication process of providing a thick highly resistive neutron transmuted substrate, growing a heavily doped epitaxial layer overlying the substrate, thinning the substrate, and forming active devices on the backside of the substrate. As discussed, the desired high voltage characteristics are achieved by tailoring the thicknesses and doping concentrations of the substrate and epitaxially grown layer. The resulting device provides high voltage capability (above 1000 volts) which can be economically produced with present technology.

High Voltage IGBT or thyristor

Figure 4A:
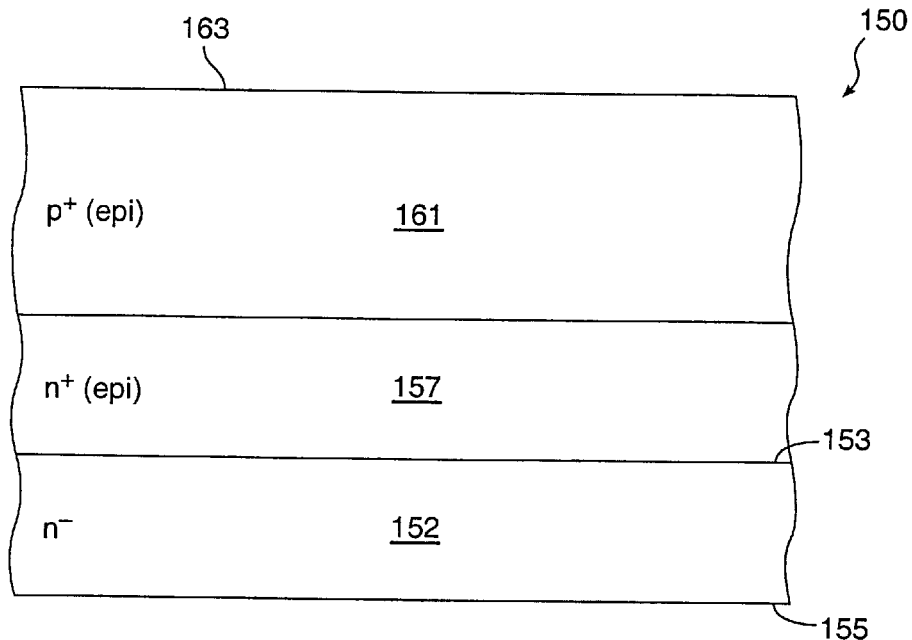
FIG. 4A is a cross-sectional view of an embodiment of an improved substrate for a high voltage IGBT or thyristor.

FIG. 4A shows an embodiment of a substrate 150 for a high voltage device such as, for example, a high voltage IGBT or thyristor according to the present invention. An n semiconductor substrate 152 having high resistivity is provided. This substrate has a front surface 153 and a backside 155. This wafer may be a silicon substrate, gallium arsenide substrate, or the like. Alternatively, high voltage applications typically require this substrate to be a neutron transmuted wafer. An n+epitaxial layer 157 is then grown on and in contact with the front surface of the substrate. This layer is followed by a p$^+$ epitaxial layer 161 on and in contact with the n$^+$ epitaxial layer. As shown, the p$^+$ epitaxial layer has a top surface 163. Alternatively, the layers overlying the substrate may comprise multiple p-type and n-type layers. To provide the desired device characteristics, the number of layers as well as their conductivity type can be adjusted according. This present embodiment, however, relies upon the n$^+$ epitaxial layer in combination with the p$^+$ epitaxial layer overlying the substrate for illustrative purposes only.

To produce the desired high voltage characteristics, doping levels as well as thicknesses of layers 152, 157, and 161 are adjusted accordingly. As for the thickness of the substrate, one polishes, backgrinds, or thins down the highly resistive substrate from its backside to produce the desired thickness. The substrate has a thickness between about 200$\mu$ and 500$\mu$ or greater where a higher voltage device requires the thicker substrate. In addition, the substrate also provides, for example, an impurity concentration of about $10^{13}$ atoms/cm$^3$. Therefore, the epitaxial layers are grown to desired resistivities and thicknesses during fabrication. These epitaxial layers are easily grown at their high dopant levels. In contrast, a thick highly resistive epitaxial layer having a low level of impurity is difficult to grow with present technology.

To complete the device, the wafer is turned upside-down and further processing is performed on its backside. As shown, the thinned down n$^-$ substrate forms the n$^-$ base layer and a backside. The active device is fabricated onto the backside of the wafer within the n$^-$ base layer. Standard processing techniques as shown below are employed to complete fabrication of, for example, an IGBT or thyristor.

Figure 4B:
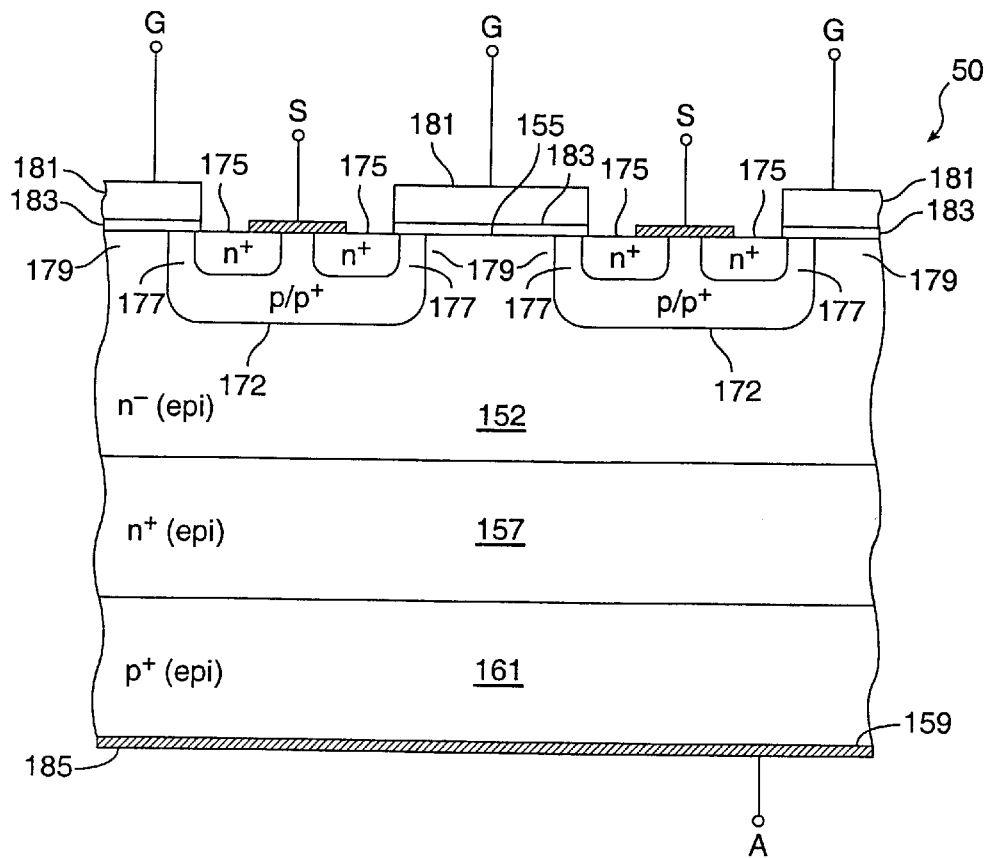
FIG. 4B is a cross-sectional view of an embodiment of a high voltage IGBT or thyristor.

As for the IGBT, FIG. 4B is an embodiment of the improved high voltage IGBT 170 fabricated on the substrate shown in FIG. 4A according to the present invention. The device fabricated employs, for example, n-channel technology for illustrative purposes only. The IGBT is typically fabricated by a DMOS process similar to that of the prior art, except further processing of the active device is done on the backside of the wafer. The inverted substrate includes the p$^+$ injection layer 161, n$^+$ buffer layer 157, and n$^-$ substrate 152 forming the n$^-$ base layer. A plurality of p/p$^+$ well regions 172 are formed within the n$^-$ base layer, and are adjacent to the backside 155. A plurality of sources (S) are defined by the n$^+$ source regions 175 within the p/p$^+$ well regions. As shown, channel regions 177 are within the p/p$^+$ well regions, are adjacent to the backside, and are between the source regions and portions 179 of the n$^-$ base layer. A plurality of gates (G) are defined as polysilicon layers 181 overlying a layer of oxide 183 over the channel region. The completed device also includes an anode (A) defined by the metallization 185 overlying the top surface 161. The unique aspect of this device includes the n$^-$ base layer formed from a highly resistive semiconductor substrate.

For thyristor operation, the device shown in FIG. 4B requires modification as follows. The thyristor is typically characterized by being able to latch-up after switching it on. As discussed, latch-up is promoted by decreasing the doping in the p/p$^+$ well regions while heavily the epitaxial layers, thereby increasing the gain through the device. IGBT operation, however, requires low resistivity through the n$^-$ substrate which does not promote latch-up. Thus, the dopant levels within each layer must be adjusted accordingly to provide either the IGBT or thyristor operation.

The embodiments shown in FIGS. 4A and 4B all have high voltage capability. This high voltage capability comes from the combination comprising a thick highly resistive neutron transmuted substrate and a heavily doped epitaxial layer overlying the substrate. To produce the desired high voltage characteristics, the thicknesses and doping concentrations of the substrate and epitaxially grown layers are adjusted accordingly. The resulting device can be economically produced with present technology and provides high voltage (above 1000 volts) characteristics.

While the above is a full description of the specific embodiments, various modifications, alternative constructions, and equivalents may be used. For example, while the description above is in terms of an n-channel device, it would be possible to implement the present invention with a p-channel device, or the like. The embodiments shown may comprise, for example, cells which are all connected in parallel. Alternatively, these regions may comprise stripes or the like defining the active device. Furthermore, while the embodiments shown are generally in terms of an MOSFET, thyristor, and IGBT, it would be possible to implement the improved substrate in the present invention with any device such as, for example, an MCT, or the like.

Therefore, the above description and illustrations should not be taken as limiting the scope of the present invention which is defined by the appended claims.

What is claimed is:

1. A method of fabricating a high voltage MOS switching device comprising:

providing a semiconductor substrate having a backside and a front surface, said semiconductor substrate being a resistive semiconductor substrate;

forming a semiconductor layer directly on and in contact with said front surface of the substrate, said semiconductor layer being a heavily doped epitaxial layer of low resistivity relative to said semiconductor substrate to achieve a desired growth rate and capability of operating in high power applications;

reducing a thickness of said substrate from said backside;

turning said substrate up-side-down; and forming a plurality of active MOS devices on said backside, wherein said semiconductor layer and said substrate are adjusted to produce a desired breakdown voltage characteristic, said device having a breakdown voltage greater than about 1000 volts.

2. The method of claim 1 wherein said semiconductor layer has a desired layer thickness and said substrate has a desired substrate thickness to produce a desired breakdown voltage characteristic.

3. The method of claim 2 wherein said turning is done after said reducing.

4. The method of claim 1 wherein said semiconductor layer has a desired doping level and said substrate has a desired doping level to produce a desired breakdown voltage characteristic.

5. The method of claim 4 wherein said desired doping level is at about $10^{13}$ atoms/cm$^3$.

6. The method of claim 1 wherein said reducing is accomplished by an operation selected from a group consisting of back grinding, polishing, or thinning.

7. The method of claim 1 wherein said substrate is a neutron transmuted substrate.

8. The method of claim 1 wherein said substrate thickness is about 200 $\mu$m and greater.

9. The method of claim 1 wherein said substrate thickness is about 500 $\mu$m and greater.

10. The method of claim 1 wherein said reducing is done after said providing and said layer forming.

* * * * *